United States Patent
Lin et al.

(10) Patent No.: US 10,224,304 B2
(45) Date of Patent: Mar. 5, 2019

(54) CONDUCTIVE ADHESIVE FILM STRUCTURES

(71) Applicant: Apple Inc., Cupertino, CA (US)

(72) Inventors: Wei Lin, Santa Clara, CA (US); Nathan K. Gupta, San Francisco, CA (US); Po-Jui Chen, Taipei (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/421,194

(22) Filed: Jan. 31, 2017

(65) Prior Publication Data

US 2018/0082971 A1 Mar. 22, 2018

Related U.S. Application Data

(60) Provisional application No. 62/398,265, filed on Sep. 22, 2016.

(51) Int. Cl.
*H01L 23/00* (2006.01)
*C09J 9/02* (2006.01)
(Continued)

(52) U.S. Cl.
CPC ............. *H01L 24/29* (2013.01); *C09J 9/02* (2013.01); *C09J 11/04* (2013.01); *H01L 24/32* (2013.01); *H01L 24/83* (2013.01); *C08K 7/00* (2013.01); *C08K 9/02* (2013.01); *C08K 2003/0806* (2013.01); *C08K 2003/0862* (2013.01); *H01L 2224/2929* (2013.01); *H01L 2224/29347* (2013.01); *H01L 2224/29439* (2013.01); *H01L 2224/29455* (2013.01); *H01L 2224/29499* (2013.01); *H01L 2224/32227* (2013.01); *H01L 2224/83201* (2013.01); *H01L 2924/01028* (2013.01); *H01L 2924/01029* (2013.01);
(Continued)

(58) Field of Classification Search
CPC .......... H01L 2924/00014; H01L 51/56; H01L 2224/48091; H01L 51/5253; H01L 51/5246
USPC ...................................................... 257/738
See application file for complete search history.

(56) References Cited

U.S. PATENT DOCUMENTS 5,162,087 A * 11/1992 Fukuzawa ................ C08K 9/08
252/500
6,210,831 B1 * 4/2001 Gorkovenko ....... H01M 4/0485
429/213
(Continued)

*Primary Examiner* — Andy Huynh
(74) *Attorney, Agent, or Firm* — Dickinson Wright RLLP

(57) ABSTRACT

Conductive adhesive films can include a binding material having a first set of conductive particles therewithin. The binding material can be electrically non-conductive and can flow between and bond external electronic components during a bonding process. The first set of conductive particles can each have cores formed of a first material, such as polymer, and coatings surrounding the cores, the coatings formed of a second material that is electrically conductive, such as nickel. The binding material can also include a second set of smaller conductive particles formed of a third material that is electrically conductive, such as copper, which can have coatings formed of a fourth material that is electrically conductive, such as silver. The first set of conductive particles can each be sphere shaped, and the second set of conductive particles can each be flake shaped. The conductive particles can form electrical paths between the external electronic components.

20 Claims, 7 Drawing Sheets

(51) Int. Cl.
  *C09J 11/04* (2006.01)
  *C08K 7/00* (2006.01)
  *C08K 9/02* (2006.01)
  *C08K 3/08* (2006.01)

(52) U.S. Cl.
  CPC ............ *H01L 2924/01047* (2013.01); *H01L 2924/07811* (2013.01)

(56) References Cited

U.S. PATENT DOCUMENTS

| | | |
|---|---|---|
| 6,352,775 B1 * | 3/2002 | Sasaki .................... B32B 27/06 428/403 |
| 6,977,025 B2 | 12/2005 | McArdle et al. |
| 7,998,305 B2 | 8/2011 | Cobbley et al. |
| 8,518,304 B1 * | 8/2013 | Sammakia ............... H01B 1/22 174/257 |
| 8,802,214 B2 | 8/2014 | Liang et al. |
| 9,153,354 B2 | 10/2015 | Baran et al. |
| 9,475,963 B2 | 10/2016 | Liang et al. |

* cited by examiner

CONDUCTIVE ADHESIVE FILM STRUCTURES

CROSS REFERENCE TO RELATED APPLICATION

This application claims priority under 35 U.S.C. § 119(e) to U.S. Provisional Patent Application No. 62/398,265, filed Sep. 22, 2016, and entitled "CONDUCTIVE ADHESIVE FILM STRUCTURES," which is incorporated herein by reference in its entirety and for all purposes.

FIELD

The described embodiments relate generally to adhesive materials. More particularly, the described embodiments relate to conductive adhesive film structures that bond and provide electrical connections for electronic device components.

BACKGROUND

It is often desirable to couple electronic device components in a manner that also provides electrical contacts. This can sometimes involve the use of an adhesive that facilitates electrical contacts. An anisotropic conductive film ("ACF") is one example of a conductive adhesive film having electrically conductive particles dispersed within a binder material. ACFs are commonly used, for example, in the manufacture of liquid crystal displays to bond and create electrical connections between display components and integrated circuit ("IC") components. In some applications, an ACF is placed between electrodes of a display component and electrodes of another electronic or IC component. The components are then pressed together such that both a mechanical bonding and electrical connections are made. The resulting structure is anisotropic with unidirectional electrical connections between the display component and the IC component (e.g., z direction) but no electrical connections between adjacent electrodes of the display component or IC component (e.g., x or y directions).

Various ACF and other conductive adhesive film applications can include providing a foil shield for electronic components, such as touch screen sensors or other items where signal shielding is preferable. In some applications, it is also desirable for there to be flexibility in and around the foil shield region. Due to this desire for flexibility, as well as the bonding nature of ACFs and other similar films, this has traditionally required that the foil shield have multiple stacked layers. This results in relatively high costs and a significant thickness to the foil shield.

While existing conductive adhesive films have worked well in the past, there can be room for improvement. Accordingly, there is a need for improved conductive adhesive film structures that bond and provide electrical connections for electronic device components.

SUMMARY

Representative embodiments set forth herein include various structures, methods, and features for the disclosed conductive adhesive film structures. In particular, the embodiments disclosed set forth systems and methods for providing conductive adhesive film structures with robust functionality while being thinner and cheaper than existing conductive adhesive films.

According to various embodiments, the disclosed systems and methods can provide improved conductive adhesive films suitable for bonding electronic components. An exemplary conductive adhesive includes a binding material configured to flow between and bond electrical contacts during a bonding process. The binding material is electrically non-conductive. The conductive adhesive also includes a first conductive particle contained within the binding material. The first conductive particle includes a non-electrically conductive core surrounded by a first electrically conductive material. The conductive adhesive further includes a second conductive particle contained within the binding material. The second conductive particle is composed of a second electrically conductive material and is smaller than the first conductive particle.

According to some embodiments, an electronic device is described. The electronic device includes a first electronic component having a first electrical contact and a second electronic component having a second electrical contact. The electronic device also includes a conductive adhesive electrically coupling the first electronic component to the second electronic component. The conductive adhesive includes a first conductive particle and a second conductive particle. The first conductive particle includes a non-electrically conductive core surrounded by a first electrically conductive material. The second conductive particle is composed of a second electrically conductive material and is smaller than the first conductive particle.

According to further embodiments, a method of coupling electronic components is described. The method involves placing a conductive adhesive between a first electrical contact of a first electronic component and a second electrical contact of a second electronic component. The conductive adhesive includes a first conductive particle and second conductive particle contained within a binding material. The first conductive particle includes a non-electrically conductive core surrounded by a first electrically conductive material. The second conductive particle is composed of a second electrically conductive material and is smaller than the first conductive particle. The methods also involves compressing the conductive adhesive between the first electrical contact and the second electrical contact, thereby forming an electrical path between the first electrical contact and the second electrical contact.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described will become apparent from the following Detailed Description, Figures, and Claims.

BRIEF DESCRIPTION OF THE DRAWINGS

The included drawings are for illustrative purposes and serve only to provide examples of possible structures and methods for the disclosed conductive adhesive film structures. These drawings in no way limit any changes in form and detail that may be made to the embodiments by one skilled in the art without departing from the spirit and scope of the embodiments. The embodiments will be readily understood by the following detailed description in conjunction with the accompanying drawings, wherein like reference numerals designate like structural elements.

DETAILED DESCRIPTION

Various conductive adhesive film applications can include providing a flexible foil shield for electronic components, such as touch screen sensors or other items where flexibility and signal shielding are desirable. Due to this desire for flexibility, as well as the bonding nature of ACFs and other similar bonding films, this has traditionally required that the foil shield have multiple stacked layers. This results in a significant thickness to the foil shield, as well as a relatively high cost. While existing conductive adhesive films have worked well in the past, there can be room for improvement. Accordingly, there is a need for improved conductive adhesive film structures that facilitate the bonding of electronic device components.

According to various embodiments, the disclosed systems and methods can provide improved conductive adhesive films suitable for bonding electronic components. These conductive adhesive films can be anisotropic in nature, and can include at least a binding material and one or more sets of conductive particles contained therein. The binding material can be electrically non-conductive and can flow during a bonding process to bond other external electronic components. Some or all of the conductive particles can have a core formed of a first material and a coating formed of a second material that is electrically conductive, the coating surrounding the core. Anisotropic electrical paths between the external electronic components that include the conductive particles can be formed when the binding material flows.

In various embodiments, the core can be a flexible polymer, while the coating can be a metal, such as nickel. The binding material can also include a second set of smaller conductive particles that help to form the electrical paths. Each of the second set of conductive particles can be formed of a third material that is electrically conductive, such as copper, and each can have a coating that is formed of a fourth material that is electrically conductive, such as silver. The first set of conductive particles can each be sphere shaped, and the second set of conductive particles can be flake shaped, having a length that is at least ten times greater than its thickness. An exemplary application can include a foil aluminum shield having the foregoing conductive adhesive film on one or both sides thereof.

The foregoing approaches provide various methods, components, and features for the disclosed conductive adhesive film structures. A more detailed discussion of these methods, components, and features thereof is set forth below and described in conjunction with FIGS. 1-6, which illustrate detailed diagrams of devices and components that can be used to implement these methods, components, and features.

Figure 1A:
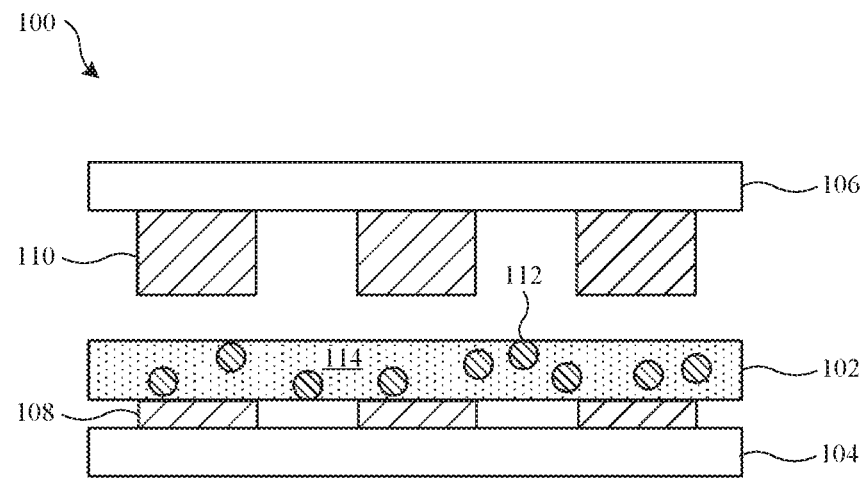
FIG. 1A illustrates in side cross-sectional view an exemplary ACF structure prior to flowing according to various embodiments of the present disclosure.

Turning first to FIG. 1A, an exemplary ACF structure prior to flowing is shown in side cross-sectional view. In pre-flow arrangement 100, an electrically conductive film 102 is positioned between a first substrate 104 and a second substrate 106. In the case of a display assembly, for example, first substrate 104 can correspond to an IC substrate and second substrate 106 can correspond to a display substrate as part of a display assembly. In some embodiments, the IC substrate can be a flexible circuit substrate. First substrate 104 includes first bonding pads (which can be referred to as first contacts or first electrical contacts) 108 that are electrically coupled to an electrical circuit of first substrate 104. Likewise, second substrate 106 includes second bonding pads 110 (which can be referred to as second contacts or second electrical contacts) that are electrically coupled to an electrical circuit of second substrate 106. Bonding pads 108 and 110 can be referred to as contact pads or contacts. Electrically conductive film 102 includes conductive particles 112 that are dispersed within binding material 114, which can be composed of any suitable material including suitable resin or polymer material. Binding material 114 can be primarily liquid form when applied between substrates 104 and 106, and can transition to a solid form using a curing process. In some embodiments, conductive particles 112 are isotropically (i.e., evenly) distributed within binding material 114. Conductive particles 112 generally have an average diameter on the scale of a few micrometers, with electrically conductive film 102 having a thickness on the scale of tens of micrometers. In one embodiment, conductive particles 112 have an average diameter of about 3 to 4 micrometers.

Figure 1B:
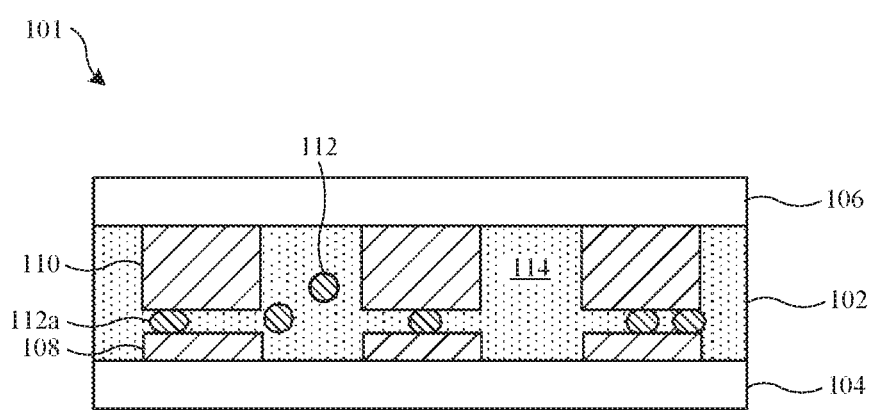
FIG. 1B illustrates in side cross-sectional view an exemplary ACF structure after flowing according to various embodiments of the present disclosure.

Continuing with FIG. 1B, an exemplary ACF structure after flowing is similarly shown in side cross-sectional view. In post-flow arrangement 101, the first substrate 104 is bonded to the second substrate 106 by compressing first substrate 104 and second substrate 106 together under high pressure and temperature conditions. For example, a bonding machine set at temperatures of about 100 to about 200 degrees Celsius can be used. The high temperature and pressure conditions cause the viscosity of electrically conductive film 102 to decrease and become liquefied. As such, binding material 114 spreads within the voids between first substrate 104 and second substrate 106. In addition, conductive particles 112 move with the flow of binding material 114 and become redistributed within the compressed space between first substrate 104 and second substrate 106. In this way, some of conductive particles 112, such as conductive particle 112a, get trapped between first bonding pads 108 and second bonding pads 110. In particular, particle 112a gets trapped between spatially matched first bond pad 108 and second bond pad 110. After some time (e.g., a few seconds), binding material 114 cools downs and becomes solid again. The resultant ACF structure includes conductive particles 112 positioned between first bonding pads 108 and second bonding pads 110, which thereby provides electrical conduction between the electrical circuits of first substrate 104 and the electrical circuits of second substrate 106. In an ideal ACF structure, conductive particles 112 provide electrical paths between first bonding pads 108 and second bonding pads 110, but not between adjacent bonding pads (e.g., between adjacent first bonding pads 108 or between adjacent second bonding pads 110). This preferential vertical or z-direction conduction is what gives ACF structure 100 its ideally anisotropic electrical conduction characteristic.

Figure 2A:
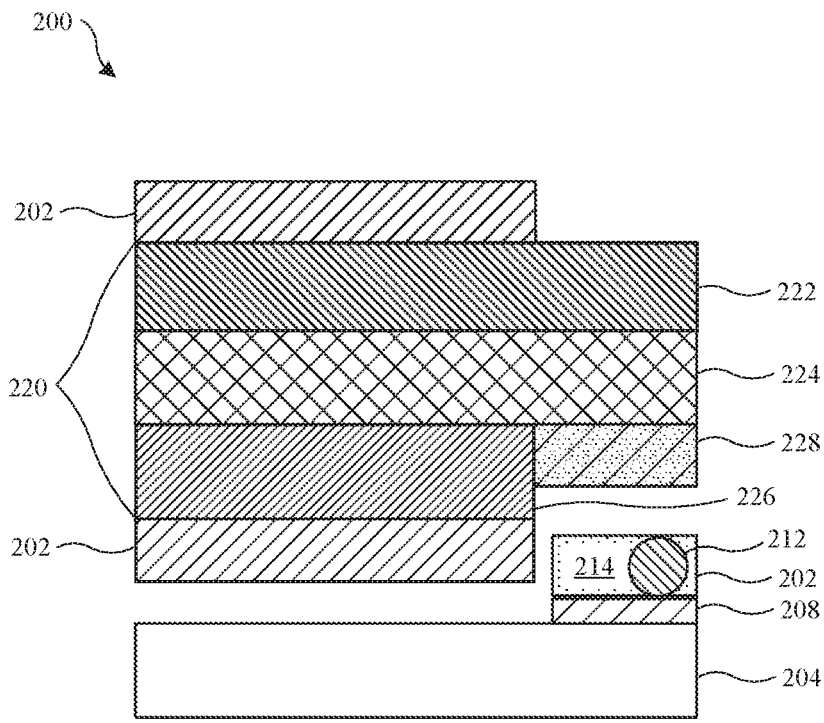
FIG. 2A illustrates in side cross-sectional view an exemplary conductive adhesive film application using a polyimide and copper foil shield according to various embodiments of the present disclosure.

FIG. 2A illustrates in side cross-sectional view an exemplary conductive adhesive film application using a polyimide and copper foil shield according to various embodiments of the present disclosure. Arrangement 200 includes a sensor 204 or other suitable substrate or electronic component, which can have one or more bonding pads 208 or other suitable electrical contacts. A foil shield 220 can be placed atop sensor 204, which can be accomplished by way of a layer of conductive adhesive film 202 at one surface of the foil shield 220. Another layer of conductive adhesive film 202 can also be located above the foil shield 220, which other layer can be used to bond one or more other electronic components to another surface of the foil shield that is opposite the surface where the sensor 204 is located. Foil shield 220 can be a flexible printed circuit, and/or can provide EMF shielding and/or other benefits to the sensor 204 or other electronic component that it shields. Foil shield 220 can include multiple flexible layers, such as a non-conductive layer 222, a conductive layer 224, and a coverlay 226 that provides access to one or more electrical contacts 228. In some arrangements, the non-conductive layer 222 can be a flexible polyimide substrate, the conductive layer 224 can be copper, the coverlay 226 can be a thin polyimide, and the electrical contact(s) 228 can be electroless nickel immersion gold ("ENIG"), for example. The electrical contact(s) 228 can provide a ground path for the sensor 204 via the bonding pad(s) 208 in some arrangements.

In various arrangements, the foil shield 220 can be coupled with the two layers of conductive adhesive film 202 on the top and bottom thereof to form a roll-to-roll material suitable for mass manufacturing operations. The thickness of the foil shield 220 itself can be about 34 to 37 micrometers. In various applications, the foil shield 220 and conductive adhesive film 202 stack can be located at both a top and bottom surface of the sensor 204 or other electronic component, such that the sensor 204 is sandwiched between two separate stacks having a foil shield 220. Because separate foil shields 220 can be located both above and below the planar sensor 204 layer then, the total thickness for both foil shields can then be about 70 micrometers or more in some arrangements.

In the portion shown as contacting sensor 208, the conductive adhesive film 202 can have a binding material 214 containing conductive particles 212 therein, similar to that which is provided above for electrically conductive film 102 having a binding material 114 containing conductive particles 112 therein. Similar to the foregoing arrangement, binding material 214 can be an organic resin configured to flow during a high temperature and pressure bonding process, and conductive particles 212 can be isotropically distributed within the binding material 214 and configured to facilitate the creation of electrical paths between the bonding pads 208 and electrical contacts 228.

Figure 2B:
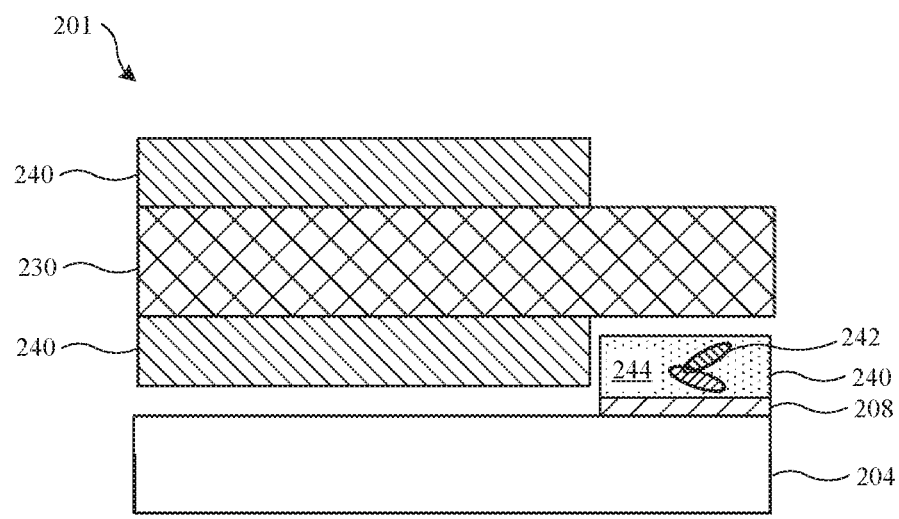
FIG. 2B illustrates in side cross-sectional view an exemplary conductive adhesive film application using an aluminum foil shield according to various embodiments of the present disclosure.

FIG. 2B illustrates in side cross-sectional view an exemplary conductive adhesive film application using an aluminum foil shield according to various embodiments of the present disclosure. Arrangement 201 similarly includes a sensor 204 or other suitable substrate or electronic component, which can have one or more bonding pads 208 or other suitable electrical contacts. A foil shield 230 can similarly be placed atop sensor 204, which can similarly be accomplished by way of a layer of conductive adhesive film 240 at one surface of the foil shield 230. Again, another layer of conductive adhesive film 240 can also be located above the foil shield 230, which other layer can be used to bond one or more other electronic components to another surface of the foil shield that is opposite the surface where the sensor 204 is located. Foil shield 230 can similarly be flexible, and can provide EMF shielding and/or other benefits to the sensor 204 or other electronic component that it shields. Unlike foregoing arrangement 200, however, the foil shield 230 of arrangement 201 can simply comprise a layer of aluminum foil. In some arrangements, foil shield 230 may also include a thin layer of aluminum oxide as well. The aluminum foil shield 230 can provide a ground path for the sensor 204 via the bonding pad(s) 208 in some arrangements.

In various arrangements, the foil shield 230 can be coupled with the two layers of conductive adhesive film 240 on the top and bottom thereof to form a roll-to-roll material suitable for mass manufacturing operations. The thickness of the foil shield 230 can be about 20 to 25 micrometers in some arrangements, which provides a significant reduction in thickness to the previous foil shield. In various applications, the foil shield 230 and conductive adhesive film 240 stack can similarly be located at both a top and bottom surface of the sensor 204 or other electronic component, such that the sensor 204 is sandwiched between two separate stacks having a foil shield 230. In arrangements where separate foil shields 230 are located both above and below the sensor 204 layer then, this results in a total foil shield thickness of about 40 to 50 micrometers. Accordingly, use of an aluminum foil shield results in a total stack thickness that is about 20 to 30 micrometers less than the total stack thickness of a traditional polyimide and copper foil shield. Furthermore, the cost of aluminum foil shield 230 is significantly less than the cost of foil shield 220 above.

In the portion shown as contacting sensor 208, the conductive adhesive film 240 can be an anisotropic conductive film or an isotropic conductive film. Also, the conductive adhesive film 240 can have a binding material 244 containing conductive particles 242 therein. Binding material 244 can be a polymer, such as an organic resin configured to flow during a high temperature and pressure bonding process. Conductive particles 242 can be isotropically distributed within the binding material 244 and configured to facilitate the creation of electrical paths between the bonding pads 208 and the aluminum foil shield 230. Unlike the foregoing arrangements, the conductive particles 242 can have substantially different properties, and may be different from each other in some ways, as set forth in greater detail below.

The embodiments described herein provide alternative conductive adhesive film structures that are suitable for use with flexible foil shields formed from aluminum rather than polyimide and copper. In some embodiments, the alternative conductive adhesive film structures include a first set of conductive particles that may be coated, described below with reference to FIGS. 3A-3B. In some embodiments, the alternative conductive adhesive film structures include first and second sets of conductive particles that may be coated and having varying properties, described below with reference to FIGS. 4A-4D. An exemplary method for coupling electronic components using such an alternative conductive adhesive film structure is provided at FIG. 6, and an exemplary device having such a film structure is provided at FIG. 7.

Figure 3A:
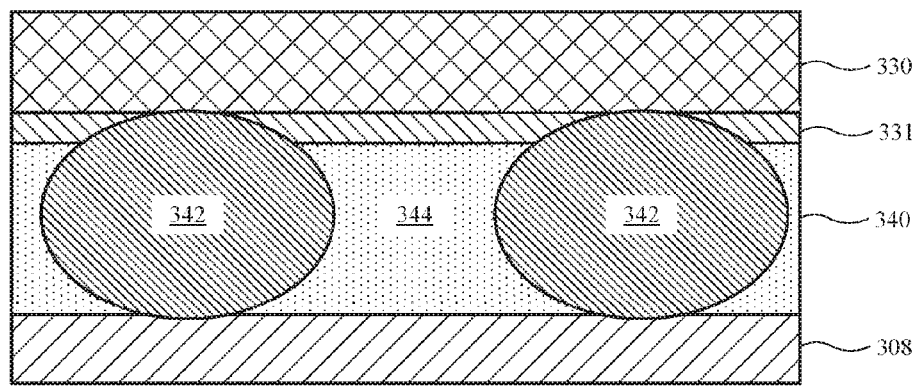
FIG. 3A illustrates in side cross-sectional view an exemplary conductive adhesive film structure for use with an aluminum foil shield according to various embodiments of the present disclosure.

FIG. 3A illustrates in side cross-sectional view an exemplary conductive adhesive film structure for use with an aluminum foil shield according to various embodiments of the present disclosure. Post-flow arrangement 301 depicts a close-up view of what one alternative conductive adhesive film structure looks like after flowing with respect to a suitable bonding pad 308 as one external electronic component and an aluminum layer 330 as another external electronic component. It will be readily appreciated that the bonding pad 308 can be included on a surface of a larger sensor or other suitable electronic component (not shown), and that the aluminum layer 330 can be part of a larger aluminum foil shield suitable for providing shielding for the larger sensor or other electronic component. Similar to the foregoing example, aluminum layer 330 can be a foil layer that is about 20 to 25 micrometers thick in some arrangements. Bonding pad 308 can be a copper, copper alloy, or ENIG pad, for example, among other possible types of electrical connectors. In addition, an aluminum oxide layer 331 or other suitable passivation or protective layer may also be formed at the surface of the aluminum layer 330.

As shown, a conductive adhesive layer 340 has flowed during a bonding process to couple and provide electrical connectivity between the bonding pad 308 and aluminum layer 330. Conductive adhesive layer 340 can be an anisotropic conductive film or an isotropic conductive film. Conductive adhesive layer 340 can include a binding material 344 and a plurality of conductive particles 342 that provide electrical paths from the bonding pad 308 to the aluminum layer 330. These electrical paths created from the bonding pad 308 to the aluminum layer 330 can be ground paths, for example. The binding material 344 can be a polymer, such as an organic resin configured to flow during a high temperature and pressure bonding process. In various embodiments, binding material 344 can comprise an acrylic, epoxy, elastomer, other resin, coupling agent (e.g., silane or siloxane), or any suitable mixture thereof. The binding material 344 may also include a corrosion inhibitor in some arrangements, so as to limit the amount of corrosion to the aluminum layer.

In various embodiments, the conductive particles 342 can be solid nickel particles, which are hard enough to dent through aluminum oxide layer 331 to provide the electrical paths. Due to the relative inelasticity of nickel and mismatches in the thermal expansion properties of the various components, however, there can be some drawbacks with the use of arrangement 301 over time, particularly with respect to cycled use and low resiliency over time. In particular, nickel can be sufficiently hard, but is relatively inelastic and not resilient. Accordingly, further examples using multiple materials for the conductive particles are also provided.

Figure 3B:
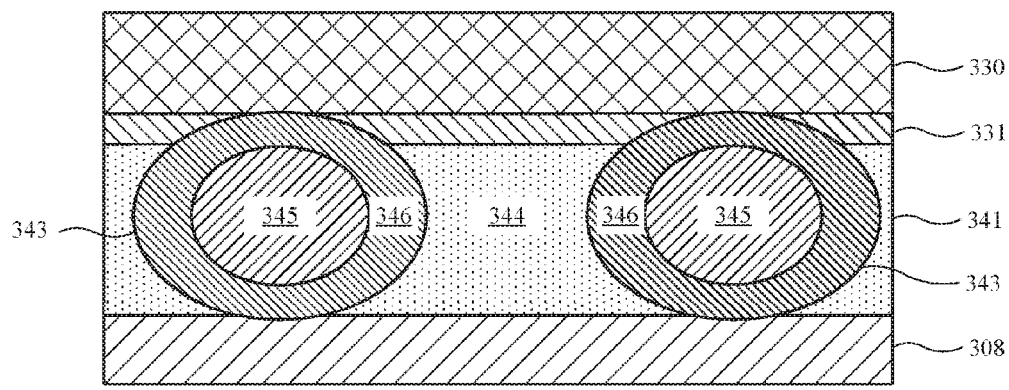
FIG. 3B illustrates in side cross-sectional view an exemplary conductive adhesive film structure having coated particles for use with an aluminum foil shield according to various embodiments of the present disclosure.

FIG. 3B illustrates in side cross-sectional view an exemplary conductive adhesive film structure having coated particles for use with an aluminum foil shield according to various embodiments of the present disclosure. Post-flow arrangement 303 similarly depicts a close-up view of what another alternative conductive adhesive film structure looks like after flowing with respect to a suitable bonding pad 308 as one external electronic component and an aluminum layer 330 as another external electronic component. Again, it will be readily appreciated that the bonding pad 308 can be included on a surface of a larger sensor or other suitable electronic component (not shown), and that the aluminum layer 330 can be part of a larger aluminum foil shield suitable for providing shielding for the larger sensor or other electronic component. Similar to the foregoing example, aluminum layer 330 can be a foil layer that is about 20 to 25 micrometers thick in some arrangements. Bonding pad 308 can be a copper, copper alloy, or ENIG pad, for example, among other possible types of electrical connectors. In addition, an aluminum oxide layer 331 or other suitable passivation or protective layer may also be formed at the surface of the aluminum layer 330.

As shown, a conductive adhesive layer 341 has flowed during a bonding process to couple and provide electrical connectivity between the bonding pad 308 and aluminum layer 330. Conductive adhesive layer 341 can be an anisotropic conductive film or an isotropic conductive film. Conductive adhesive layer 341 includes a binding material 344, as detailed above, and a plurality of coated conductive particles 343 that provide electrical paths from the bonding pad 308 to the aluminum layer 330. These electrical paths created from the bonding pad 308 to the aluminum layer 330 can be ground paths, for example. In various embodiments, the coated conductive particles 343 can form about 10% of the volume of conductive adhesive layer 341, and/or these coated conductive particles 343 can be spherical or substantially spherical in shape. In various embodiments, the coated conductive particles 343 can be mono-dispersed throughout the binding material 344, with each of the particles having a size that is within about 10% of a standard size for the set of particles. This standard size for the coated conductive particles 343 can be a diameter of between about 5 to 30 micrometers. In some arrangements, this diameter can be about 25 micrometers.

Each coated conductive particle 343 can have a core 345 of one material and a coating 346 (also referred to as a shell) of another different material, with the coating preferably being electrically conductive. For example, coated conductive particles 343 can have cores 345 that are a flexible polymer and coatings 346 that are an electrically conductive material, such as a metal. In various embodiments, the coating 346 can have a thickness of about 1 to 2 micrometers. Preferably, the combination of materials is hard enough to dent through aluminum oxide layer 331 to provide the electrical paths, while still having sufficient elasticity and resiliency still to provide reliable electrical paths over time, many use cycles, and/or many thermal cycles.

Various combinations of materials for coated conductive particles 343 have been found to provide varying results. For example, where the cores 345 are a flexible polymer and the coatings 346 are gold, the resulting coated conductive particles 343 tend to be too soft to dent through the aluminum oxide layer 331 to reach the aluminum layer reliably. As another example, where the cores 345 are a flexible polymer and the coatings 346 are nickel, there can be adequate denting through the aluminum oxide layer 331 due to the nickel coatings, as well as sufficient elasticity or retraction in the particles due to the flexible polymer cores. In some embodiments, coatings 346 are composed of nickel and another metal, such as gold. As another example, where the cores 345 are copper and the coatings 346 are silver, there can be a good amount of denting through the aluminum oxide layer 331, but a lesser amount of elasticity or retraction in the particles due to the metal cores. In general then, good results can be obtained using coated conductive particles 343 having flexible cores 345 and hard and electrically conductive coatings 346. In some embodiments, the cores 345 can be a flexible polymer that is also electrically conductive, such as a polymer saturated with a metallic powder, for example. This can provide added conductivity across a given coated conductive particle 343.

Figure 4A:
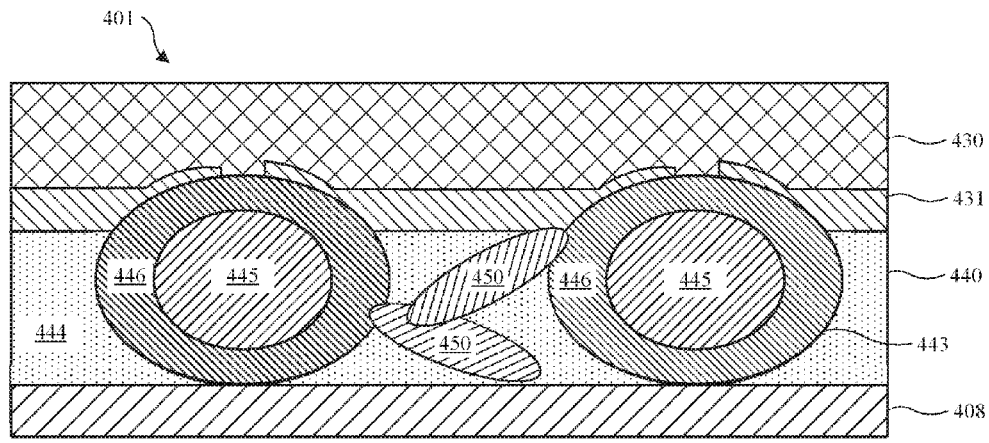
FIGS. 4A and 4B illustrate in side cross-sectional views an exemplary conductive adhesive film structure having a first set of coated sphere-shaped particles and a second set of flake-shaped particles for use with an aluminum foil shield according to various embodiments of the present disclosure.
Figure 4B:
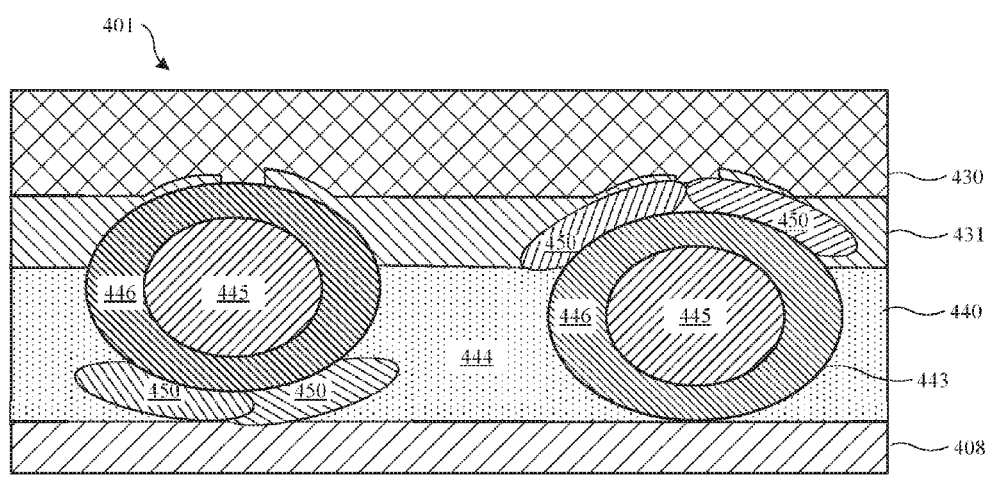

FIGS. 4A and 4B illustrate in side cross-sectional views an exemplary conductive adhesive film structure having a first set of coated sphere-shaped particles and a second set of flake-shaped particles for use with an aluminum foil shield according to various embodiments of the present disclosure. Post-flow arrangement 401 is similar to foregoing examples in that it also depicts a close-up view of what yet another alternative conductive adhesive film structure looks like after flowing with respect to a suitable bonding pad 408 as one external electronic component and an aluminum layer 430 as another external electronic component. Again, it will be readily appreciated that the bonding pad 408 can be included on a surface of a larger sensor or other suitable electronic component (not shown), and that the aluminum layer 430 can be part of a larger aluminum foil shield suitable for providing shielding for the larger sensor or other electronic component. Similar to the foregoing examples, aluminum layer 430 can be a foil layer that is about 20 to 25 micrometers thick in some arrangements. Bonding pad 408 can be a copper, copper alloy, or ENIG pad, for example, among other possible types of electrical connectors. In addition, an aluminum oxide layer 431 or other suitable passivation or protective layer may also be formed at the surface of the aluminum layer 430.

As shown, a conductive adhesive layer 440 has flowed during a bonding process to couple and provide electrical connectivity between the bonding pad 408 and aluminum layer 430. Conductive adhesive layer 440 can be an anisotropic conductive film or an isotropic conductive film. Conductive adhesive layer 440 includes a binding material 444, a first set of coated conductive particles 443, and a second set of conductive particles 450. Binding material 444 can be identical or substantially similar to binding material 344 above. Both sets of conductive particles 443 and 450 help to provide electrical paths from the bonding pad 408 to the aluminum layer 430. These electrical paths created from the bonding pad 408 to the aluminum layer 430 can again be ground paths, for example. The first set of coated conductive particles 443 can be spherical or substantially spherical in shape in various embodiments.

Each coated conductive particle 443 can again have a core 445 of one material and a coating 446 of another different material, with the coating preferably being electrically conductive. Preferably, the combination of materials is hard enough to dent through aluminum oxide layer 431 to provide the electrical paths to the aluminum layer 430, as shown. In some embodiments, the cores 445 can be a flexible polymer while the coatings 446 can be nickel. In some variations, the first set of coated conductive particles 443 can be further coated with a thin layer of gold (not shown), which additional coating can function to provide even greater electrical conductivity. Again, coated conductive particles 443 can form about 10% of the volume of conductive adhesive layer 440, can be spherical or substantially spherical in shape, can be mono-dispersed throughout the binding material 444, and each of the particles having a size that is within about 10% of a standard size for the set of particles, with the standard size diameter being between about 5 to 30 micrometers. In some arrangements, this diameter can be about 25 micrometers. The coatings 446 can have a thickness of about 1 to 2 micrometers.

In various embodiments, the second set of conductive particles 450 can include solid particles that are smaller than the particles in the first set of coated conductive particles 443. The second set of conductive particles 450 can be composed of any suitable conductive material. In some particular embodiments, the second set of conductive particles 450 are formed of solid copper. The conductive particles 450 of second set can be substantially smaller than the conductive particles 443 of the first set. For example, the conductive particles 443 of the first set can be at least four times larger than the conductive particles 450 of the second set. In particular embodiments, the diameters of the conductive particles 443 of the first set are at least four times greater than the lengths of the conductive particles 450 of the second. In this manner, the second set of conductive particles 450 can serve to fill gaps in the flowed binding material 444 to create parts of and/or enhance the existing electrical paths created by the first set of coated conductive particles 443 between the bonding pad 408 and the aluminum layer 430. For example, in some, many, or all locations, a given coated conductive particle 443 may not contact both the aluminum layer 430 and the underlying bonding pad 408. In such locations, one or more of the second set of conductive particles 450, which again may be smaller in size, can bridge the gap between the coated conductive particle and the bonding pad 408 to create a complete electrical path. For example, a given electrical path through the binding material 444 may include a single coated conductive particle 443 and multiple conductive particles 450. Again, such an electrical path can be a ground path. In some embodiments, all of the electrical paths to the aluminum layer 430 can be ground paths.

Some or all of the second set of conductive particles 450 can be flake shaped in some embodiments. That is, some or all of these conductive particles can define a length and a thickness where the length is substantially greater than the thickness. In some cases, the second set of conductive particles 450 have lengths that are about ten times greater than their widths, or greater. This is sometimes referred to as an aspect ratio (length-to-width) of about 10 to 1 (10:1) or greater. For example, the length can be about 5 micrometers, while the width is about 0.5 micrometers for many or all of the second set of conductive particles 450. Due to this flake shape, and the smaller nature of the second set of conductive particles 450, these secondary particles are better configured to fill gaps and bridge contacts where the sphere shaped and primary first set of conductive particles 443 may not complete a given electrical contact or connection. For example, where compression or reflowing of the binding material 444 and overall conductive adhesive layer 440 is restricted, the use of the second set of conductive particles 450 helps to complete electrical paths where the first set of conductive particles 443 provides most or a substantial portion of the electrical paths. In this manner, there can be some electrical paths formed where no single particle contacts both of the bonding pad 408 and the aluminum layer 430. Due to the small nature of the second set of conductive particles 450, however, it is unlikely for these particles alone to establish any given electrical path, particularly where their density within the binding material is appropriately controlled. This can serve to prevent or limit the amount of electrical path shorts between contacts of the same electronic component, for example.

FIG. 4B shows how second set of conductive particles 450, due to their smaller size and/or flake shape, can become positioned between the first set of conductive particles 443 and aluminum layer 430 and bonding pad 408 during the bonding process (i.e., based on the flow of binding material 444). This positioning of the second set of conductive particles 450 can occur when the bonding surface areas of bonding pad 408 and/or aluminum layer 430 are relatively large. For example, in some applications the bonding area of bonding pad 408 is between about 0.5 mm$^2$ to about 2 mm$^2$. In some applications the bonding area of bonding pad 408 is between about 6.5 mm$^2$ to about 2.5 cm$^2$. In particular, when bonding pad 408 and aluminum layer 430 have relatively large bonding surface areas, they may bow during the compression process due, thereby creating spaces between bonding pad 408 and aluminum layer 430 in middle regions the bonding pad 408. Without the first set of conductive particles 443, binding material 444 can flow in these larger spaces, which creates an insulation gap and blocking electrical coupling. The smaller second set of conductive particles 450 can become positioned in these constrained spaces between aluminum layer 430 and bonding pad 408, thereby bridging the conductive path between aluminum layer 430 and bonding pad 408. FIGS. 4A and 4B show how second set of conductive particles 450 can position themselves during the bonding process in a way that adapts to the local topography to create conductive paths between aluminum layer 430 and bonding pad 408. Thus, the combination of the larger first set of conductive particles 443 and the smaller second set of conductive particles 450 (which can be referred to as a hierarchical scheme) provide an electrically conductive adhesive that adapts to and self-adjusts based on the geometry of surrounding structures.

Figure 4C:
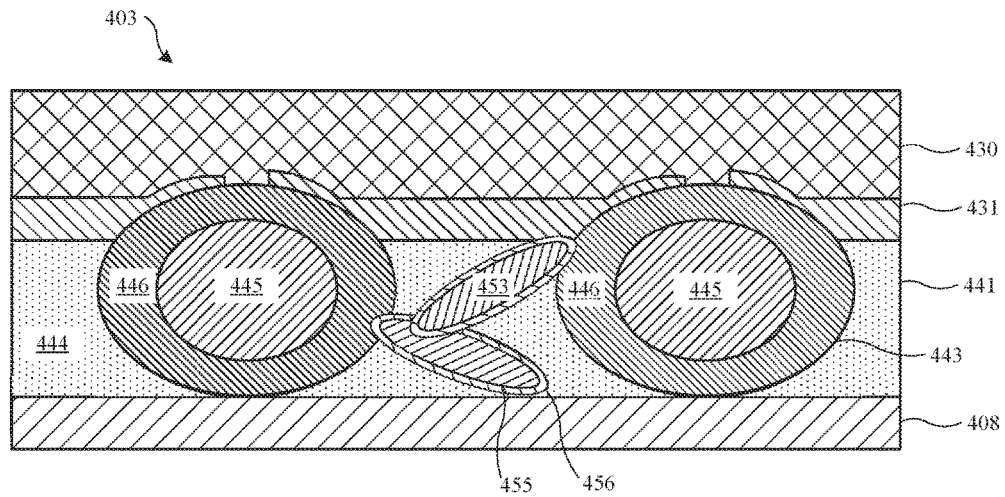
FIGS. 4C and 4D illustrate in side cross-sectional views an exemplary conductive adhesive film structure having a first set of coated sphere-shaped particles and a second set of coated flake-shaped particles for use with an aluminum foil shield according to various embodiments of the present disclosure.
Figure 4D:
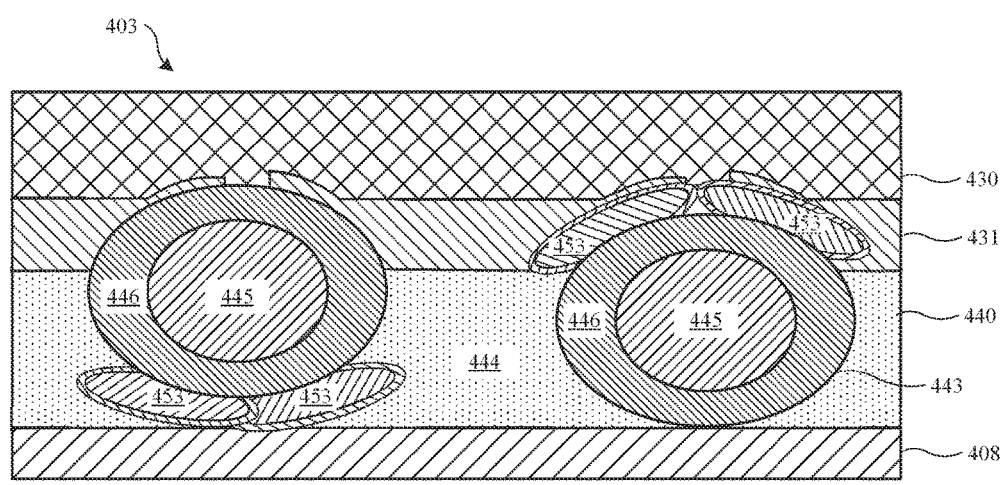

FIGS. 4C and 4D illustrate in side cross-sectional views an exemplary conductive adhesive film structure having a first set of coated sphere-shaped particles and a second set of coated flake-shaped particles for use with an aluminum foil shield according to various embodiments of the present disclosure. Post-flow arrangement 403 is similar to the foregoing examples, particularly arrangement 401 above. In particular, all items can be similar or identical to those of arrangement 401, with the exception of the second set of conductive particles 453. Unlike the foregoing arrangement 401, however, arrangement 403 can include a conductive adhesive layer 441 that can have a second set of conductive particles 453 that are coated with a different material. For example, the second set of conductive particles 453 can have cores 455 of one material and coatings 456 of another material. As one non-limiting example, the second set of conductive particles 453 can have copper cores 455 and silver coatings 456. Again, these secondary conductive particles can be flake shaped, and can be smaller than the sphere shaped primary or first set of conductive particles 443.

FIG. 4D shows how second set of conductive particles 453, become positioned between the first set of conductive particles 443 and aluminum layer 430 and bonding pad 408 during the compression process due to their smaller size and/or flake shape. As described above with reference to FIG. 4B, second set of conductive particles 453 can bridge a conductive path between aluminum layer 430 and bonding pad 408 that would otherwise be filled with insulating binder material 444 in cases where the bonding surface areas of bonding pad 408 and/or aluminum layer 430 are relatively large.

Figure 5:
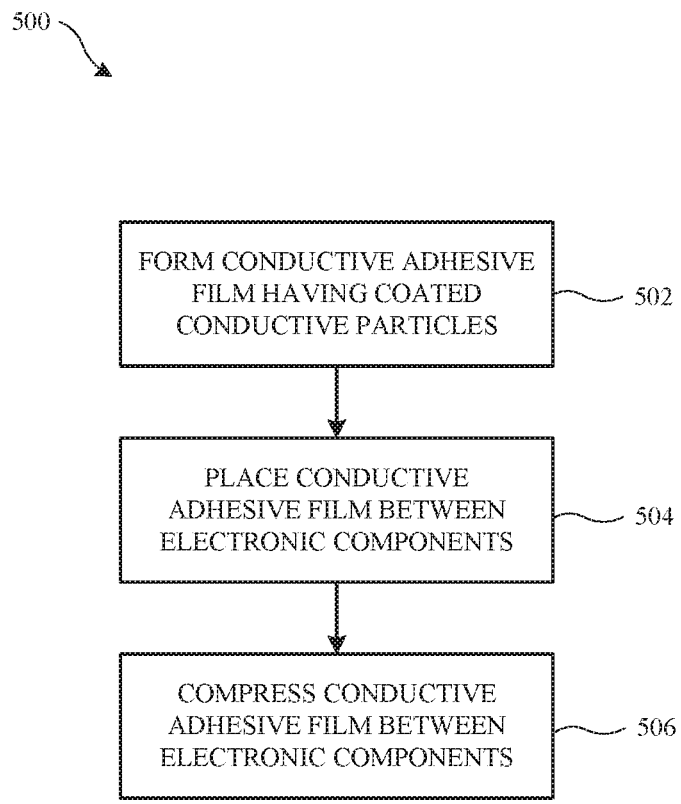
FIG. 5 illustrates a flowchart of an exemplary method for coupling electronic components according to various embodiments of the present disclosure.

Turning next to FIG. 5, a flowchart of an exemplary method for coupling electronic components is provided. Method 500 can be carried out by one or more processors or other controllers that may be associated with an automated manufacturing system, for example. Method 500 starts at a first process step 502, where a conductive adhesive film can be formed. Such a conductive adhesive film can be that of any of the foregoing examples, such as, for example, conductive adhesive layers 240, 340, 341, 440, or 441. The conductive adhesive film can comprise a binding material having various conductive particles contained therein. In some arrangements, the conductive particles can include a first set of conductive particles having a core formed of a first material and a coating surrounding the core and formed of a second material that is electrically conductive. In some embodiments, the conductive particles can further include a second set of conductive particles formed of a third material that is also electrically conductive. The second set of conductive particles may also have coatings formed of a fourth material, which may also be electrically conductive. Again, any of the foregoing arrangements can have the conductive adhesive film formed at process step 502.

At a following process step 504, the conductive adhesive film can be placed between electronic components. This can include, for example, a first electronic component having a first set of electrical contacts and a second electronic component having a second set of electrical contacts. In some embodiments, the first electronic component can be a sensor, while the second electronic component can be a foil shield. The first and second electronic components can be various display and other IC components as well. At the next process step 506, the conductive adhesive film can be compressed between the first electronic component and the second electronic component. This can be part of a bonding process, and may include a temperature increase as well. The compressing can form electrical paths between the electronic components. For example, electrical paths can be formed between the first set of electrical contacts and the second set of electrical contacts using a first set of conductive particles and a second set of conductive particles. In various embodiments, this can include a first set of sphere shaped conductive particles and a second set of smaller flake shaped conductive particles. In some embodiments, at least some of the electrical paths can have no conductive particles that contact both of the electrically coupled contacts from the first and second electronic components.

For the foregoing flowchart, it will be readily appreciated that not every step provided is always necessary, and that further steps not set forth herein may also be included. For example, added steps that involve details regarding the formation of the conductive adhesive film may be added. Also, steps that provide more detail with respect to the amount of compression force, the temperature rise, and the amount of time for a full bonding process may be added. Other steps not included may also involve testing steps for the bonded components. Further, the exact order of steps may be altered as desired, and some steps may be performed simultaneously. For example, steps 502 and 504 may be performed simultaneously in some embodiments.

Figure 6:
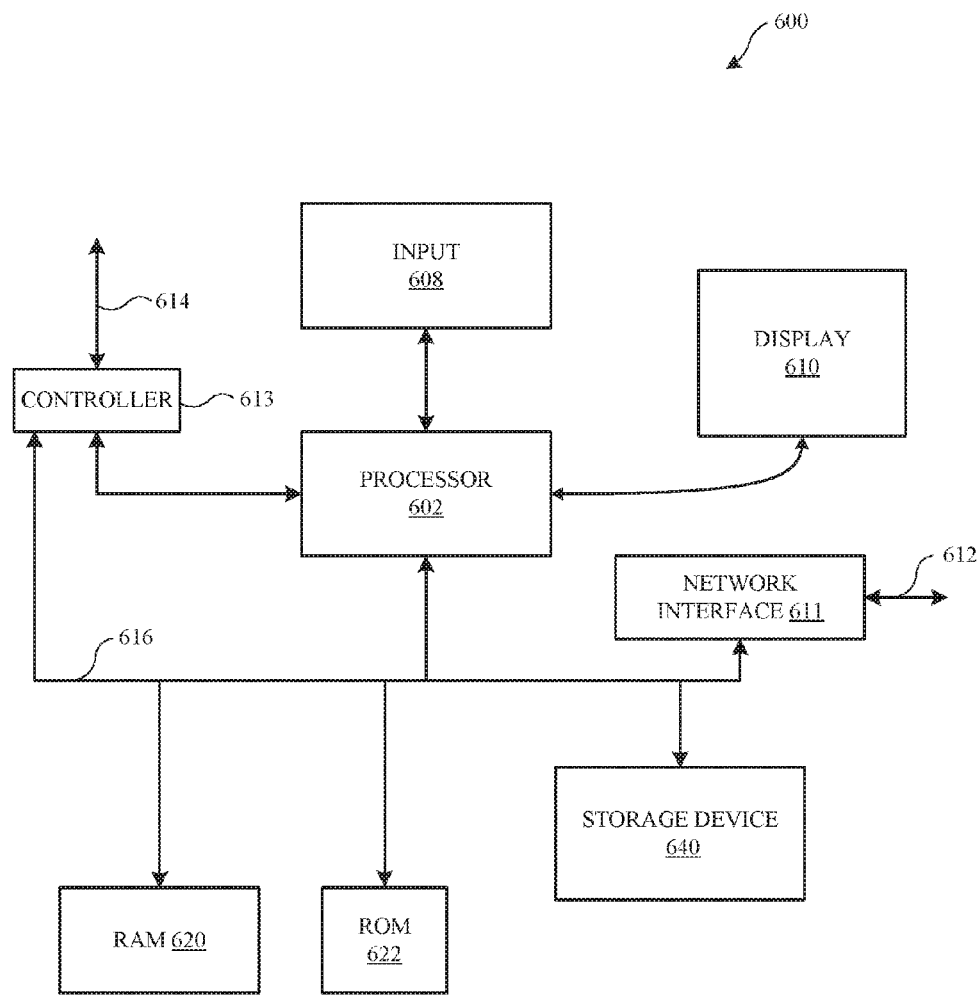
FIG. 6 illustrates in block diagram format an exemplary computing device that can contain the disclosed conductive adhesive film structures according to various embodiments of the present disclosure.

FIG. 6 illustrates in block diagram format an exemplary computing device that can contain the disclosed conductive adhesive film structures, according to some embodiments. In particular, the detailed view illustrates various components that can be included in an electronic device having anisotropic conductive films used to bond components therein, such as that which is described above with respect to FIGS. 1-5. As shown in FIG. 6, the computing device 600 can include a processor 602 that represents a microprocessor or controller for controlling the overall operation of computing device 600. The computing device 600 can also include a user input device 608 that allows a user of the computing device 600 to interact with the computing device 600. For example, the user input device 608 can take a variety of forms, such as a button, keypad, dial, touch screen, audio input interface, visual/image capture input interface, input in the form of other sensor data, etc. Still further, the computing device 600 can include a display 610 (screen display) that can be controlled by the processor 602 to display information to the user (for example, a movie or other AV or media content). A data bus 616 can facilitate data transfer between at least a storage device 640, the processor 602, and a controller 613. The controller 613 can be used to interface with and control different equipment through and equipment control bus 614. The computing device 600 can also include a network/bus interface 611 that couples to a data link 612. In the case of a wireless connection, the network/bus interface 611 can include a wireless transceiver.

The computing device 600 can also include a storage device 640, which can comprise a single disk or a plurality of disks (e.g., hard drives), and includes a storage management module that manages one or more partitions within the storage device 640. In some embodiments, storage device 640 can include flash memory, semiconductor (solid state) memory or the like. The computing device 600 can also include a Random Access Memory (RAM) 620 and a Read-Only Memory (ROM) 622. The ROM 622 can store programs, utilities or processes to be executed in a non-volatile manner. The RAM 620 can provide volatile data storage, and stores instructions related to the operation of the computing device 600.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, hard disk drives, solid state drives, and optical data storage devices. The computer readable medium can also be distributed over network-coupled computer systems so that the computer readable code is stored and executed in a distributed fashion.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A conductive adhesive, comprising:
   a binding material configured to flow between and bond electrical contacts during a bonding process, the binding material being electrically non-conductive;
   a first conductive particle contained within the binding material, wherein the first conductive particle includes a non-electrically conductive core surrounded by a first electrically conductive material; and
   a second conductive particle contained within the binding material, wherein the second conductive particle includes an electrically conductive core composed of a second electrically conductive material and the second conductive particle is smaller than the first conductive particle.

2. The conductive adhesive of claim 1, wherein the first conductive particle is characterized as having a diameter that is at least four times a length of the second conductive particle.

3. The conductive adhesive of claim 1, wherein the first conductive particle has a generally spherical shape, and the second conductive particle has a generally flake shape.

4. The conductive adhesive of claim 1, wherein the non-electrically conductive core of the first conductive particle is composed of a polymer.

5. The conductive adhesive of claim 1, wherein the first electrically conductive material is composed of nickel and the second electrically conductive material is composed of copper.

6. The conductive adhesive of claim 1, wherein the electrically conductive core of the second conductive particle is surrounded by a coating.

7. The conductive adhesive of claim 6, wherein the coating has a thickness of about 1 micrometer to about 2 micrometers.

8. The conductive adhesive of claim 6, wherein the electrically conductive core of the second conductive particle is composed of copper and the coating is composed of one or both of silver and nickel.

9. The conductive adhesive of claim 1, wherein the first conductive particle has a diameter between about 5 micrometers and about 30 micrometers.

10. The conductive adhesive of claim 1, wherein the second conductive particle has a length that is at least ten times greater than a thickness of the second conductive particle.

11. An electronic device, comprising:
    a first electronic component having a first electrical contact;
    a second electronic component having a second electrical contact; and
    a conductive adhesive electrically coupling the first electronic component to the second electronic component, the conductive adhesive including a first conductive particle and a second conductive particle, wherein the first conductive particle includes a non-electrically conductive core surrounded by a first electrically conductive material, and wherein the second conductive particle includes an electrically conductive core composed of a second electrically conductive material and the second conductive particle is smaller than the first conductive particle.

12. The electronic device of claim 11, wherein the first electrical contact is composed of aluminum and the second electrical contact is composed of copper.

13. The electronic device of claim 11, wherein the first conductive particle is characterized as having a diameter that is at least four times a length of the second conductive particle.

14. The electronic device of claim 11, wherein the non-electrically conductive core of the first conductive particle is composed of a polymer.

15. The electronic device of claim 11, wherein the first conductive particle has a generally spherical shape, and the second conductive particle has a generally flake shape.

16. The electronic device of claim 11, wherein one or both of the first electrical contact and the second electrical contact have a bonding pad characterized by a bonding area ranging between about 0.5 mm² to about 2 mm².

17. The electronic device of claim 11, wherein the electrically conductive core of the second conductive particle is surrounded by a coating.

18. The electronic device of claim 17, wherein the electrically conductive core of the second conductive particle is composed of copper and the coating is composed of one or both of silver and nickel.

19. A method of coupling electronic components, the method comprising:

placing a conductive adhesive between a first electrical contact of a first electronic component and a second electrical contact of a second electronic component, wherein the conductive adhesive includes a first conductive particle and second conductive particle contained within a binding material, wherein the first conductive particle includes a non-electrically conductive core surrounded by a first electrically conductive material, and wherein the second conductive particle includes an electrically conductive core composed of a second electrically conductive material and the second conductive particle is smaller than the first conductive particle; and compressing the conductive adhesive between the first electrical contact and the second electrical contact, thereby forming an electrical path between the first electrical contact and the second electrical contact.

20. The method of claim 19, wherein the second conductive particle is positioned between the first conductive particle and one of the first second electrical contact and the second electrical contact during the compressing.

* * * * *